(12) United States Patent
Lee et al.

(10) Patent No.: US 9,899,331 B2
(45) Date of Patent: Feb. 20, 2018

(54) FAN-OUT SEMICONDUCTOR PACKAGE AND METHOD OF MANUFACTURING SAME

(71) Applicant: SAMSUNG ELECTRO-MECHANICS CO., LTD., Suwon-si, Gyeonggi-do (KR)

(72) Inventors: Yong Koon Lee, Suwon-si (KR); Yong Jin Seol, Suwon-si (KR); Sang Kyu Lee, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/353,249

(22) Filed: Nov. 16, 2016

(65) Prior Publication Data

US 2017/0287839 A1 Oct. 5, 2017

(30) Foreign Application Priority Data

Mar. 31, 2016 (KR) .......................... 10-2016-0039348

(51) Int. Cl.
*H01L 23/31* (2006.01)
*H01L 21/76* (2006.01)
(Continued)

(52) U.S. Cl.
CPC .......... *H01L 23/5389* (2013.01); *H01L 21/56* (2013.01); *H01L 21/76802* (2013.01); *H01L 21/76877* (2013.01); *H01L 21/76895* (2013.01); *H01L 23/3128* (2013.01); *H01L 23/5383* (2013.01); *H01L 23/5384* (2013.01); *H01L 23/5386* (2013.01); *H01L 24/19* (2013.01);
(Continued)

(58) Field of Classification Search
CPC ......... H01L 24/19; H01L 24/20; H01L 23/31; H01L 23/53; H01L 23/312; H01L 23/538; H01L 23/3128; H01L 23/5383; H01L 23/5384; H01L 23/5386; H01L 21/56; H01L 21/76; H01L 21/768; H01L 21/768; H01L 21/7687; H01L 21/7689; H01L 21/76802; H01L 21/76877; H01L 21/76895
USPC ........................................................ 257/737
See application file for complete search history.

(56) References Cited

U.S. PATENT DOCUMENTS

2010/0052993 A1 3/2010 Kim
2013/0341784 A1* 12/2013 Lin .................. H01L 23/49827
257/737

FOREIGN PATENT DOCUMENTS

KR 10-2010-0028298 A 3/2010
KR 10-2015-0041529 A 4/2015

* cited by examiner

*Primary Examiner* — Monica D Harrison
(74) *Attorney, Agent, or Firm* — McDermott Will & Emery LLP

(57) ABSTRACT

A fan-out semiconductor package includes a redistribution layer, the redistribution layer including a first insulating layer, a first wiring disposed on the first insulating layer, a second insulating layer disposed on the first insulating layer and covering the first wiring, a line via passing through the second insulating layer continuously and connected to the first wiring, and a second wiring disposed on the second insulating layer and connected to the line via; a semiconductor chip disposed on one side of the redistribution layer, and having an electrode pad electrically connected to the first wiring, the second wiring, and the line via; and an encapsulant disposed on the one side of the redistribution layer, and encapsulating the semiconductor chip.

17 Claims, 14 Drawing Sheets

(51) Int. Cl.
  *H01L 23/538* (2006.01)
  *H01L 21/56* (2006.01)
  *H01L 23/00* (2006.01)
  *H01L 21/768* (2006.01)
(52) U.S. Cl.
  CPC ...... *H01L 24/20* (2013.01); *H01L 2224/2101* (2013.01); *H01L 2224/214* (2013.01)

I-I'

FAN-OUT SEMICONDUCTOR PACKAGE AND METHOD OF MANUFACTURING SAME

CROSS-REFERENCE TO RELATED APPLICATION

This application claims the benefit of priority to Korean Patent Application No. 10-2016-0039348, filed on Mar. 31, 2016 with the Korean Intellectual Property Office, the entirety of which is incorporated herein by reference.

TECHNICAL FIELD

The present disclosure relates to a fan-out semiconductor package, such as a fan-out integrated circuit (IC) package, and a method of manufacturing the same.

BACKGROUND

A fan-out semiconductor package is defined as a type of package technology for electrically connecting a semiconductor chip to a printed circuit board (PCB), such as a main board of an electronic device, or the like, and protecting the semiconductor chip from external impacts, and can be distinguished from a technology of embedding the semiconductor chip in a PCB, such as an interposer substrate.

A significant recent trend in the development of technology related to the semiconductor chip is to reduce the size of semiconductor chip. Hence, in the field of packaging, in accordance with a rapid increase in demand for compact semiconductor chip, or the like, a fan-out semiconductor package having a compact size and a reduced thickness has been demanded. By these technical requirements, the wiring of a redistribution layer serving to redistribute the semiconductor chip has recently been formed to have fine line patterns.

As such, the wiring of the redistribution layer formed to have the fine line patterns has limits in terms of being subjected to a high level of current. Thus, an increase in a level of allowable current is required.

SUMMARY

An aspect of the present disclosure may provide a fan-out semiconductor package, which may allow for an increase in a level of an allowable current even in a case in which the fan-out semiconductor package has a compact size and a reduced thickness, and a method of efficiently manufacturing the same.

An aspect of the present disclosure may connect wirings, formed in different layers, to a line via passing through an insulating layer continuously.

According to an aspect of the present disclosure, a fan-out semiconductor package may include a redistribution layer, the redistribution layer including a first insulating layer, a first wiring disposed on the first insulating layer, a second insulating layer disposed on the first insulating layer and covering the first wiring, a line via passing through the second insulating layer continuously and connected to the first wiring, and a second wiring disposed on the second insulating layer and connected to the line via; a semiconductor chip disposed on one side of the redistribution layer, and having an electrode pad electrically connected to the first wiring, the second wiring, and the line via; and an encapsulant disposed on the one side of the redistribution layer, and encapsulating the semiconductor chip.

According to an aspect of the present disclosure, a method of manufacturing a fan-out semiconductor package may include: encapsulating a semiconductor chip having an electrode pad with an encapsulant; and forming a redistribution layer on a side of the semiconductor chip on which the electrode pad of the semiconductor chip is disposed. The disposing the redistribution layer may include: forming a first insulating layer on the side of the semiconductor chip on which the electrode pad of the semiconductor chip is disposed; forming a first wiring on the first insulating layer; forming a second insulating layer covering the first wiring on the first insulating layer; forming a line via passing through the second insulating layer continuously and connected to the first wiring; and forming the second wiring connected to the line via on the second insulating layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
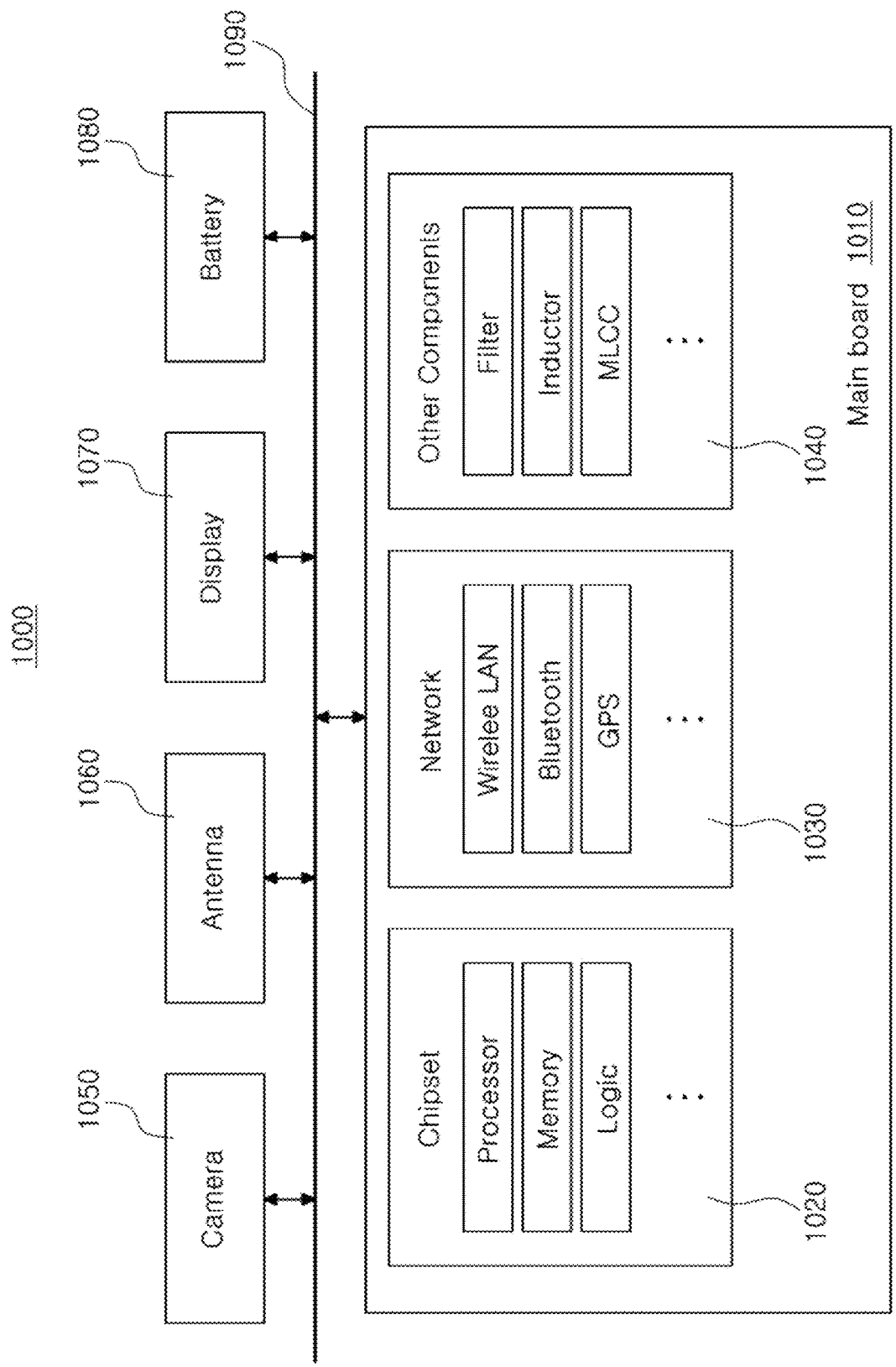
FIG. 1 is a schematic block diagram illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. A structure continuously extending or a linearly extended structure means that a length of the structure in an extending direction along which it extends is greater than a width of the structure in a width direction perpendicular to the extending direction, wherein the extending direction and the width direction are perpendicular to a thickness direction along which various layers of a package are stacked. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are the present disclosure is not limited thereto.

Electronic Device

FIG. 1 is a schematic block diagram illustrating an example of an electronic device system.

Referring to FIG. 1, an electronic device 1000 may accommodate a mother board 1010. The mother board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
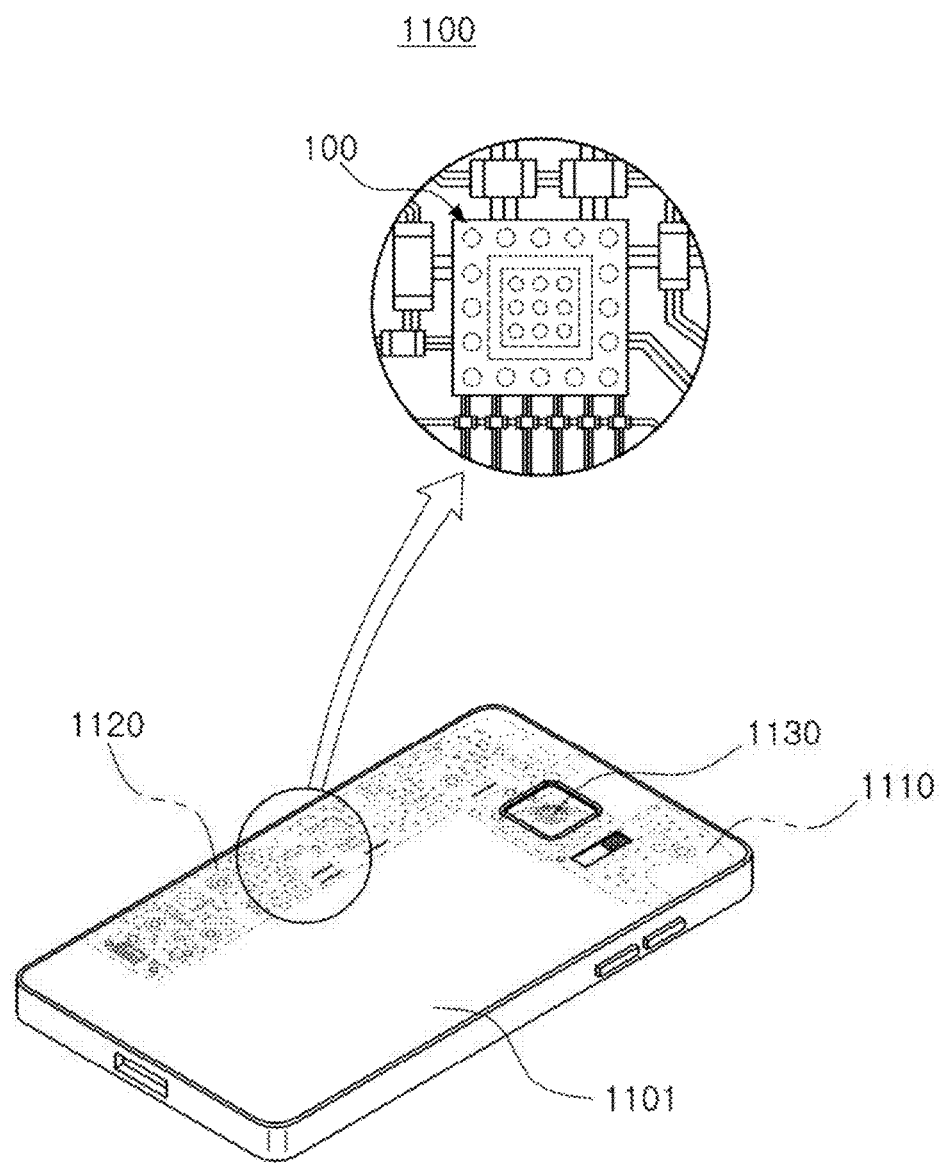
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1050, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself is not used, but is packaged and is used in an electronic device, or the like, in a packaged state.

Here, semiconductor packaging is required due to the existence of a difference in a circuit width between the semiconductor chip and a main board of the electronic device in terms of electrical connections. In detail, connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and a packaging technology for buffering a difference in a circuit width between the semiconductor chip and the main board is required.

A semiconductor package manufactured by the packaging technology may be divided into a fan-in semiconductor package and a fan-out semiconductor package depending on a structure and a purpose thereof.

The fan-in semiconductor package and the fan-out semiconductor package will hereinafter be described in more detail with reference to the drawings.

(Fan-In Semiconductor Package)

Figure 3B:
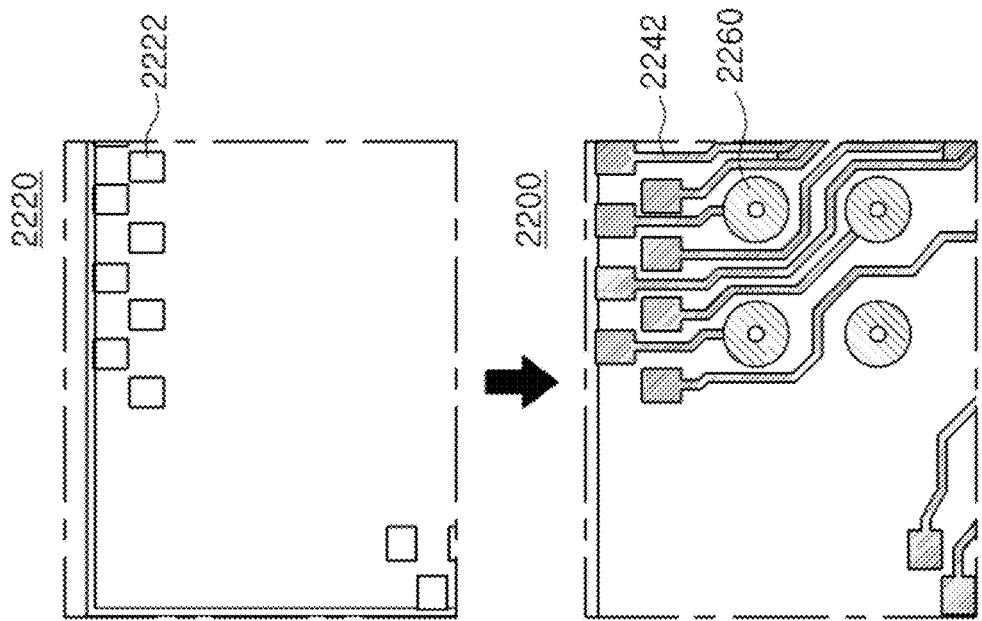
FIGS. 3A and 3B are schematic cross-sectional views illustrating states of a fan-in semiconductor package before and after being packaged.
Figure 3A:
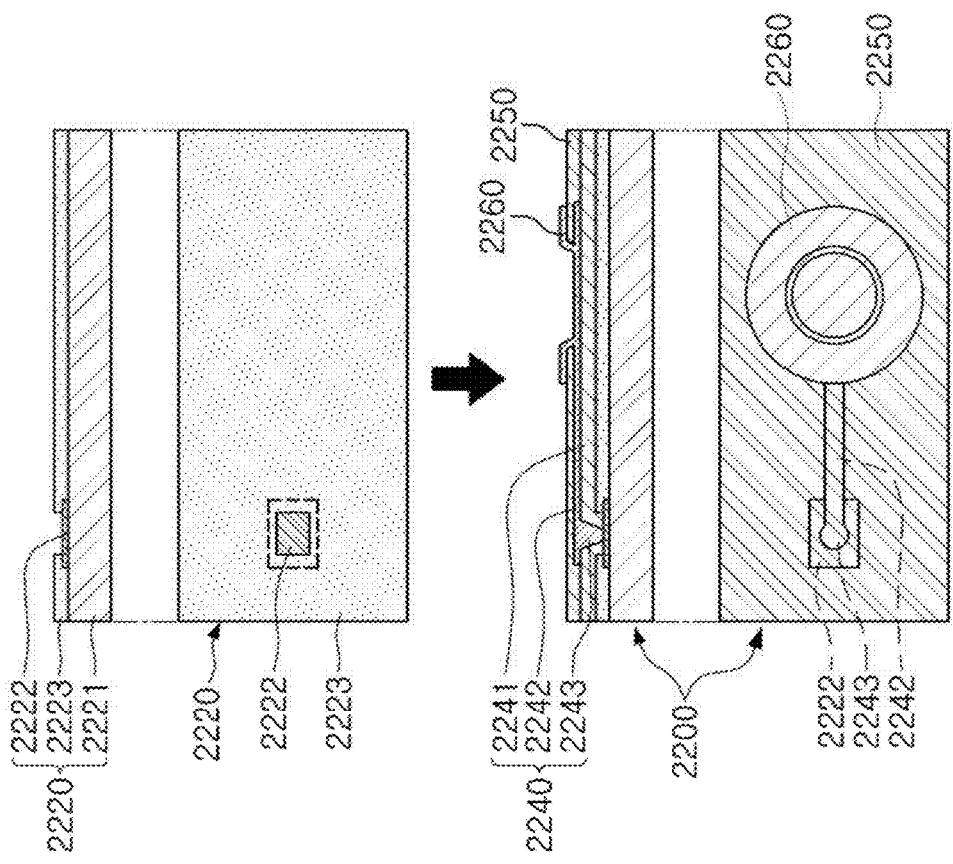

FIGS. 3A and 3B are schematic cross-sectional views illustrating states of a fan-in semiconductor package before and after being packaged.

Figure 4:
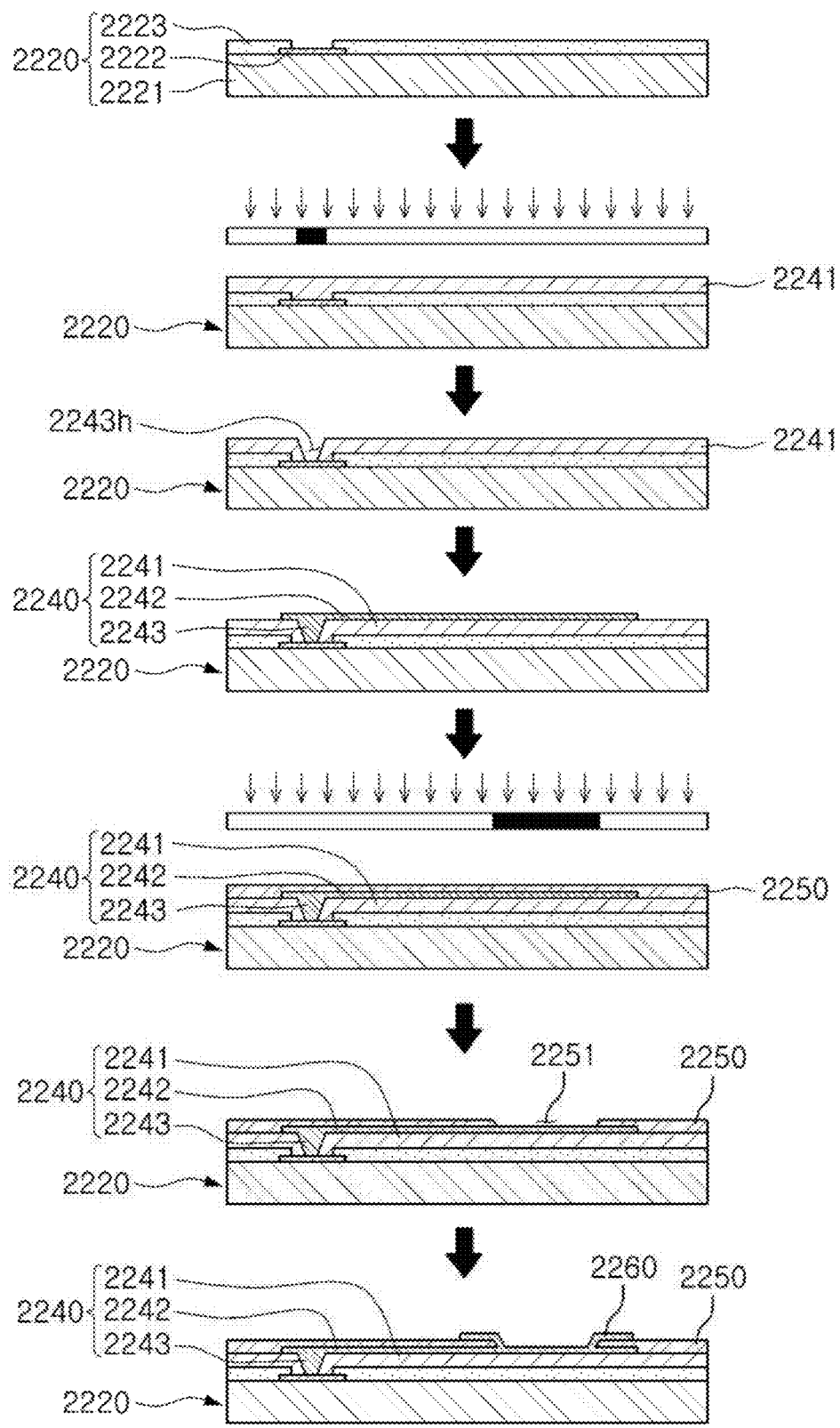
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. Here, since the connection pads 2222 are very small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in a smartphone have been manufactured in fan-in semiconductor package form. In detail, many elements mounted in the smartphone have been developed to implement a rapid signal transfer while having a compact size.

However, since all of the I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the main board of the electronic device.

Figure 5:
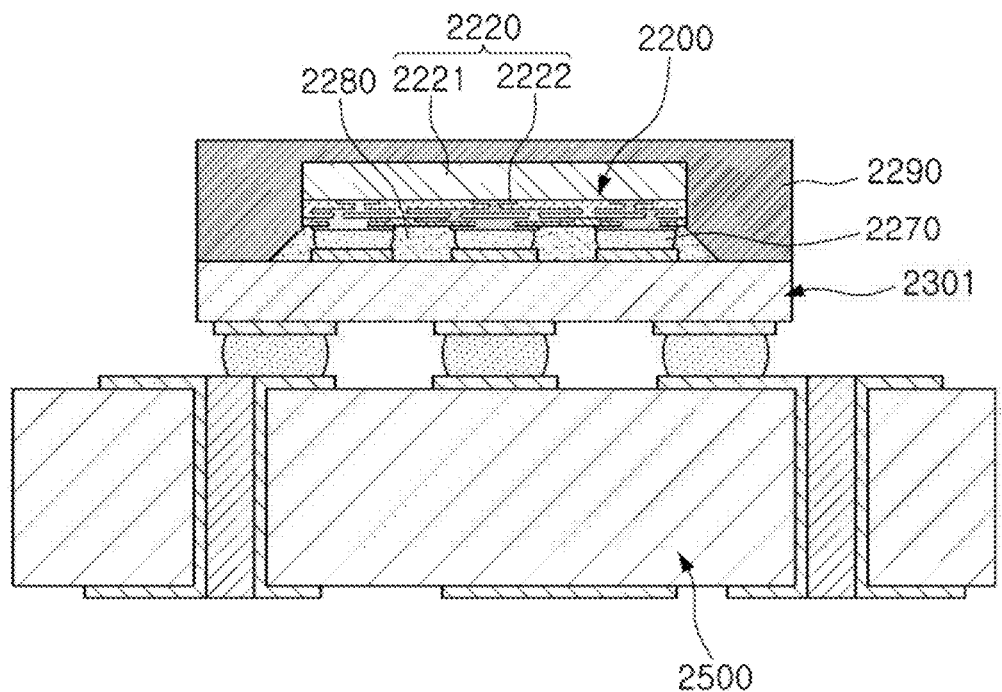
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
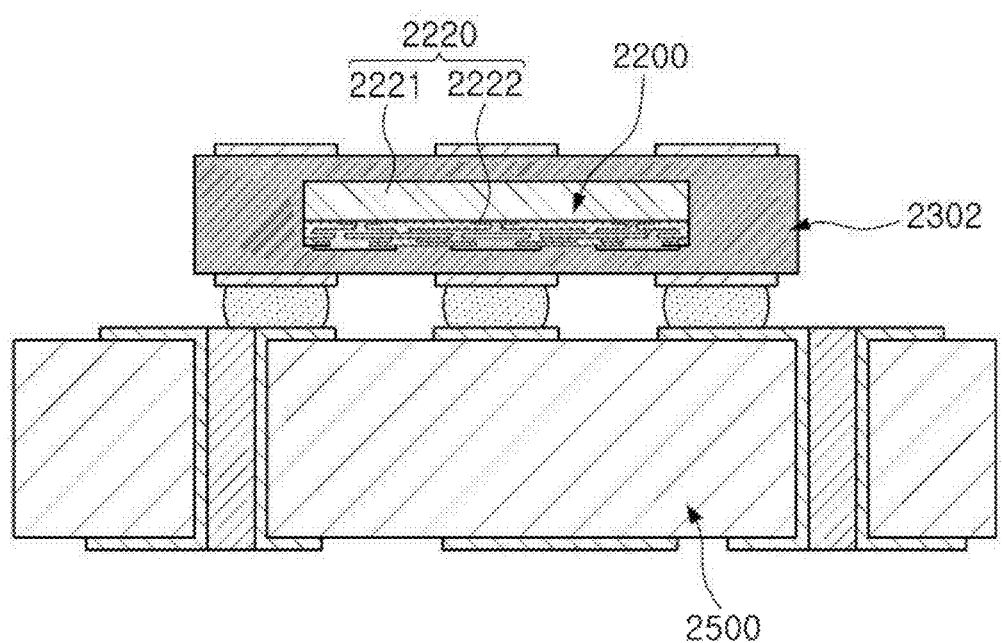
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be finally mounted on a main board 2500 of an electronic device in a state in which it is mounted on the interposer substrate 2301. Here, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

(Fan-Out Semiconductor Package)

Figure 7:
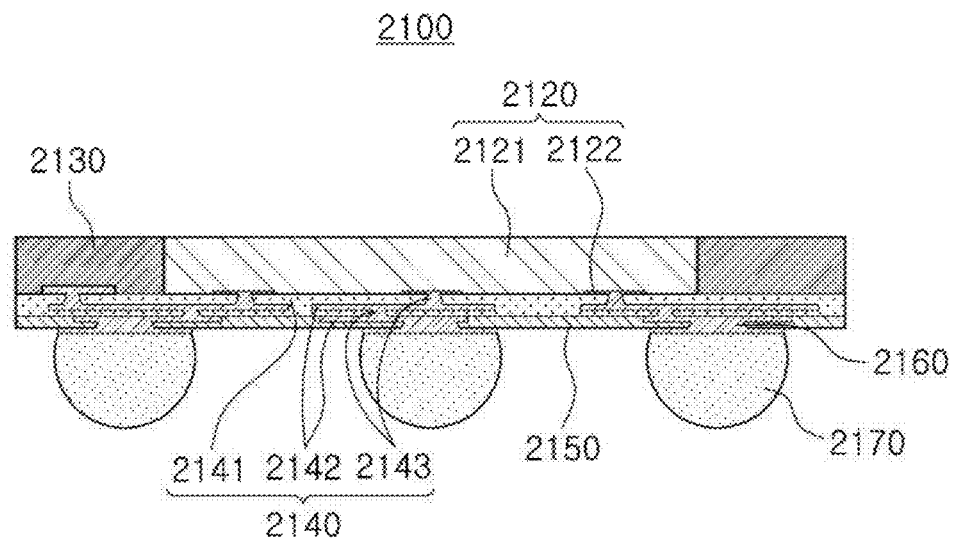
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed up to the outer side of the semiconductor chip 2120 by a connection member 2140. Here, a passivation layer 2150 may be further formed on the connection member 2140, and underbump metal layers 2160 may be further formed in openings of the passivation layer 2150. Solder balls 2170 may be further formed on the underbump metal layers 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed up outwardly of the semiconductor chip through the connection member formed on the semiconductor chip. As described above, in the fan-in semiconductor package, all of the I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed up to the outer side of the semiconductor chip through the connection member formed on the semiconductor chip as described above. Therefore, even though a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
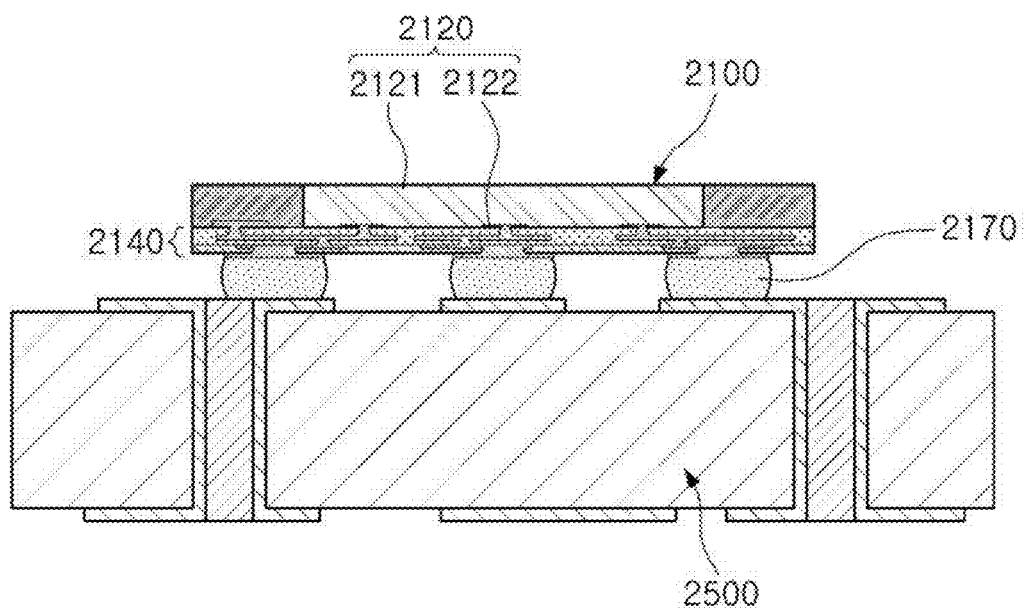
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 up to a fan-out region that is out of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness less than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to a package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9A:
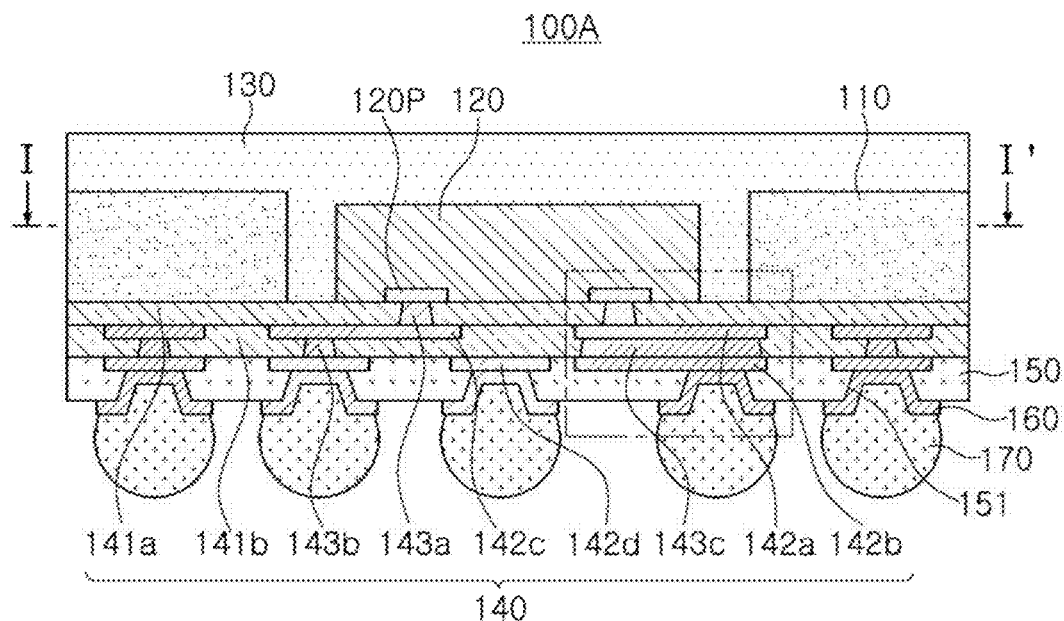
FIGS. 9A, 9B, and 9C are schematic cross-sectional views illustrating an example of a fan-out semiconductor package.
Figure 9B:
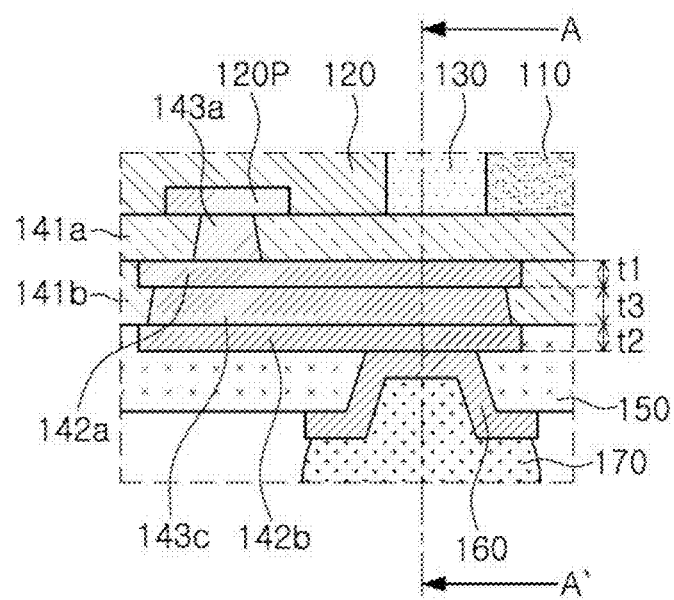
Figure 9C:
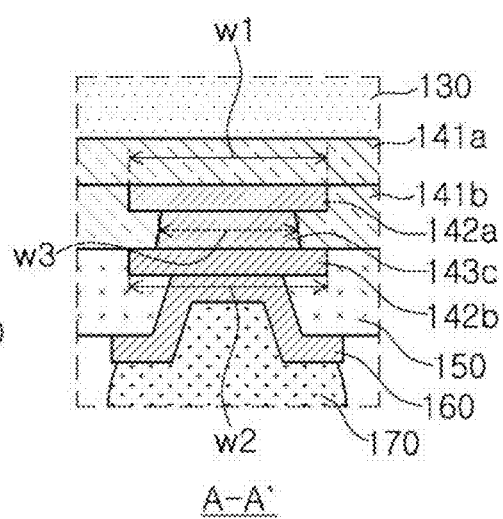

FIGS. 9A, 9B, and 9C are schematic cross-sectional views illustrating an example of a fan-out semiconductor package.

Figure 10:
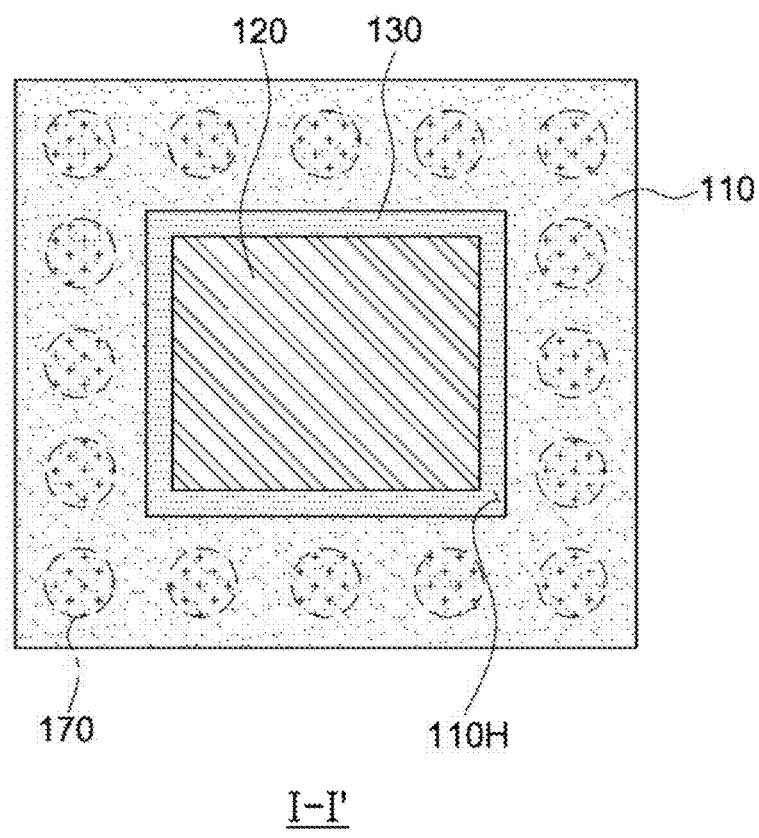
FIG. 10 is a schematic plan view of an example of a cross-sectional view taken along line I-I' of FIG. 9A.

FIG. 10 is a schematic cross-sectional plan view taken along line I-I' of the fan-out semiconductor package of FIG. 9A.

Figure 11:
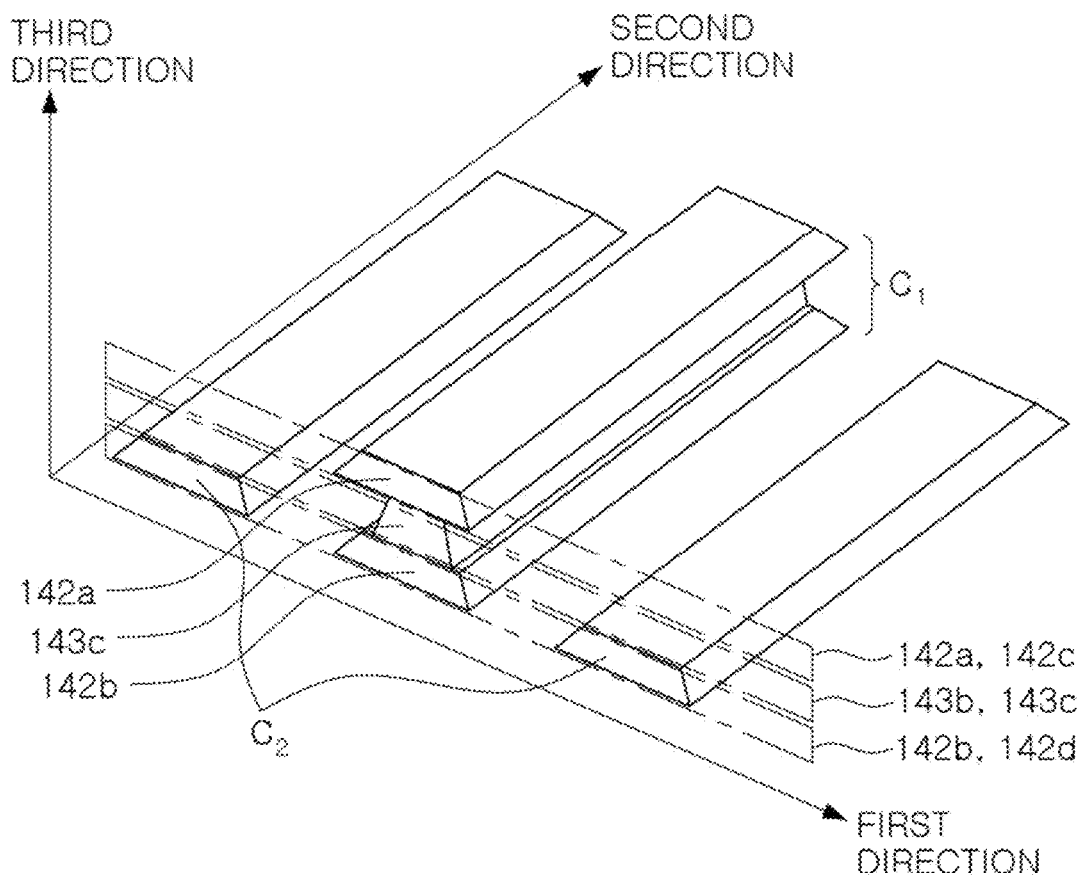
FIG. 11 is a schematic perspective view of an example of various wiring types of a redistribution layer included in the fan-out semiconductor package of FIG. 9A.

FIG. 11 is a schematic perspective view of an example of various wiring types of a redistribution layer included in the fan-out semiconductor package of FIG. 9A.

Referring to FIGS. 9A through 11, a fan-out semiconductor package 100A according to an exemplary embodiment includes a redistribution layer 140, the redistribution layer 140 including a first insulating layer 141a, a first wiring 142a disposed on the first insulating layer 141a, a second insulating layer 141b disposed on the first insulating layer 141a and covering the first wiring 142a, a line via 143c passing through the second insulating layer 141b by continuously extending in the second insulating layer 141b in a direction perpendicular to a thickness direction along which various layers are stacked and connected to the first wiring 142a, and a second wiring 142b disposed on the second insulating layer 141b and connected to the line via 143c; a semiconductor chip 120 disposed on one side of the redistribution layer 140, and having an electrode pad 120P electrically connected to the first wiring 142a, the second wiring 142b, and the line via 143c; and an encapsulant 130 disposed on the one side of the redistribution layer 140 and encapsulating the semiconductor chip 120. The line via 143c is a linearly extended via.

A significant recent trend in the development of a technology related to the semiconductor chip is to reduce the size of the semiconductor chip. Hence, in the field of packaging, in accordance with a rapid increase in demand for compact semiconductor chip, or the like, a fan-out semiconductor package having a compact size and a reduced thickness has been demanded. By these technical requirements, a redistribution layer is formed by a method of forming fine wirings in different layers based on an insulating layer and connecting the formed fine wirings by a via. As such, the fine wirings have limitations in terms of being subjected to a high level of a current.

Meanwhile, as in the fan-out semiconductor package 100A according to an exemplary embodiment, when a certain single wiring having a multilayer structure is selectively formed by connecting the first and second wirings 142a and 142b, formed indifferent layers, based on the second insulating layer 141b, by the line via 143c passing through the second insulating layer 141b formed by continuously extending the line via 143c in the second insulating layer 141b in a direction perpendicular to the thickness direction, the certain single wiring having a multilayer structure allows for a high level of an allowable current, and the allowable current may thus be increased even in a case in which the fan-out semiconductor package 100A has a compact size and a reduced thickness.

The respective components of the fan-out semiconductor package 100A according to an exemplary embodiment will hereinafter be described in more detail.

The redistribution layer 140 redistributes the electrode pad 120P of the semiconductor chip 120. Several tens to several hundreds of electrode pads 120P having various functions are redistributed by the redistribution layer 140, and physically or electrically connected to an external power source by a connection terminal 170 to be described below depending on the functions. The redistribution layer 140 includes the first insulating layer 141a, the first wiring 142a disposed on the first insulating layer 141a, the second insulating layer 141b disposed on the first insulating layer 141a and covering the first wiring 142a, the line via 143c passing through the second insulating layer 141b by continuously extending the line via 143c in the second insulating layer 141b in a direction perpendicular to the thickness direction and connected to the first wiring 142a, and the second wiring 142b disposed on the second insulating layer 141b and connected to the line via 143c.

A material of each of the first and second insulating layers 141a and 141b may be an insulating material. The insulating material may be a photosensitive insulating material such as a photoimageable dielectric (PID) resin. In this case, each of the first and second insulating layers 141a and 141b may be formed to have a further reduced thickness, and a fine pitch of each of a first via 143a and a second via 143b may be achieved more easily. Merely, the first and second insulating layers 141a and 141b are not limited thereto, and a thermosetting resin such as an epoxy resin, a thermoplastic resin such as a polyimid, or a resin, in which the thermosetting resin and the thermoplastic resin are impregnated with a stiffener such as a glass fiber or an inorganic filler may also be used. The materials of the first and second insulating layers 141a and 141b may be the same as each other, and may also be different from each other, if necessary. The first and second insulating layers 141a and 141b may be integrated with each other depending on processes, so that a boundary therebetween may not be readily apparent.

The first and second wirings 142a and 142b and the line via 143c are continuously connected to form a single wiring having a multilayer structure. The single wiring may perform various functions depending on its design. For example, the single wiring may serve as a ground (GND) pattern, a power (PWR) pattern, a signal (S) pattern, or the like. In this example, the S pattern includes various signals except for a GND pattern, a PWR pattern, or the like, for example, data signals, or the like. In addition, the single wiring may serve as a via pad, a connection terminal pad, or the like. In particular, the single wiring allows for a high level of an allowable current, and is thus used as a wiring $C_1$ that requires a higher level of a current than 1 amp or more. Further, heating may also be reduced. The first and second wirings 142a and 142b and the line via 143c may include copper (Cu), aluminum (Al), silver (Ag), tin (Sn), gold (Au), nickel (Ni), lead (Pb), titanium (Ti), or alloys thereof, but are not limited thereto.

Line widths w1 and w2 of the first and second wirings 142a and 142b may be wider than a line width w3 of the line via 143c. As such, when the line width w3 of the line via 143c is relatively narrow, the line via 143c is aligned with the first and second wirings 142a and 142b more readily.

Thicknesses t1 and t2 of the first and second wirings 142a and 142b may be less than a thickness t3 of the line via 143c. In this case, the single wiring having a multilayer structure is formed to have a further increased thickness while providing a compact, thin fan-out semiconductor package 100A, and an increase in a level of an allowable current and a reduction in heating may thus be effectively achieved.

The line via 143c has a cross-sectional length in a second direction and a third direction (a thickness direction in which the various layers are stacked), i.e., the length of the side of the line via 143c in the second direction, greater than a cross-sectional length in a first direction and the third direction, i.e., the length of the side of the line via 143c in the first direction. For example, the line via 143c has a type of a bar shape rather than an existing simple via shape. That is, the line via has a cross-sectional area in the second direction and the third direction greater than a cross-sectional area in the first direction and the third direction. For example, the line via 143c itself is continuously connected to the first and second wirings 142a and 142b to be used as a configuration of a wiring. Thus, the single wiring having a multilayer structure as described above may be formed.

The line via 143c has the cross section of the line via 143c in the second direction and the third direction and the cross section of the line via 143c in the first direction and the third direction. Each of the cross sections has a tapered shape. In this example, the tapered shape defines that a length of one side thereof is greater than that of the other side thereof, for example, a cross section thereof is trapezoidal. This means that the line via 143c may be formed using a photolithography process to thus be stably aligned with the first and second wirings 142a and 142b.

The redistribution layer 140 further includes a first via 143a passing through the first insulating layer 141a and connected to the electrode pad 120P of the semiconductor chip 120, a third wiring 142c disposed on the first insulating layer 141a and connected to the first via 143a, a second via 143b passing through the second insulating layer 141b and connected to the third wiring 142c, and a fourth wiring 142d disposed on the second insulating layer 141b and connected to the second via 143b. The first via 143a may connect the electrode pad 120P of the semiconductor chip 120 to the first wiring 142a.

The third and fourth wirings 142c and 142d are disposed in different layers. For example, each of the third and fourth wirings 142c and 142d may serve as a GND pattern, a PWR pattern, an S pattern, or the like. In addition, each of the third and fourth wirings 142c and 142d may serve as a via pad, a connection terminal pad, or the like. In particular, each of the third and fourth wirings 142c and 142d may be used as a wiring $C_2$ that allows for a relatively low level of an allowable current. As such, the fan-out semiconductor package 100A according to an exemplary embodiment enables various types of wiring designs. Each of the third wiring 142c, the fourth wiring 142d, the first via 143a, and the second via 143b may include copper (Cu), aluminum (Al), silver (Ag), tin (Sn), gold (Au), nickel (Ni), lead (Pb), titanium (Ti), or alloys thereof, but are not limited thereto.

The semiconductor chip 120 may be an integrated circuit (IC), provided in an amount of several hundreds to several millions of elements or more, integrated in a single chip. If necessary, the semiconductor chip 120 may also have an IC packaged in flip chip form. The IC may be, for example, an application processor chip such as a central processor (for example, a CPU), a graphics processor (for example, a GPU), a digital signal processor, a cryptographic processor, a microprocessor, a microcontroller, or the like, but is not limited thereto.

The semiconductor chip 120 has the electrode pad 120P electrically connected to the redistribution layer 140. The electrode pad 120P electrically connects the semiconductor chip 120 to an external power source, and may be formed of a conductive material without a particular limit. The conductive material may be copper (Cu), aluminum (Al), silver (Ag), tin (Sn), gold (Au), nickel (Ni), lead (Pb), titanium (Ti), or alloys thereof, but is not limited thereto. The electrode pad 120P is redistributed by the redistribution layer 140. The electrode pad 120P is embedded or protrudes. A surface on which the electrode pad 120P is formed as an active layer and a surface opposing the surface on which the electrode pad 120P is formed as an active layer is formed as an inactive surface. These surfaces are connected to lateral surfaces of the electrode pad 120P.

When the semiconductor chip 120 is an IC, the semiconductor chip 120 has a body, a passivation layer, and an electrode pad. The body is formed on the basis of, for example, an active wafer. A base material of the body may be silicon (Si), germanium (Ge), gallium arsenide (GaAs), or the like. The passivation layer serves to externally protect the body, and is formed of, for example, an oxide layer or a nitride layer, or also formed of a double layer of an oxide layer and a nitride layer. The electrode pad 120P is the same as described above.

The encapsulant 130 protects the semiconductor chip 120. For this purpose, the encapsulant 130 encapsulates the semiconductor chip 120. A type of encapsulation is not particularly limited as long as at least a portion of the semiconductor chip 120 is surrounded by the encapsulant 130. In an example, the encapsulant 130 covers one sides of a frame 110 to be described below and the semiconductor chip 120. In addition, the encapsulant 130 fills a space between the frame 110 and the semiconductor chip 120 in a through hole 110H to be described below. In this example, the covering means the case in which a component is located in its corresponding direction, but does not directly contact a reference component, as well as the case in which the component directly contacts the reference component. Meanwhile, the encapsulant 130 may fill the space of the through hole 110H to thus serve as an adhesive and reduce buckling of the semiconductor chip 120.

A material of the encapsulant 130 is not particularly limited. For example, the material may be an insulating material. The insulating material may be a thermosetting resin such as an epoxy resin, a thermoplastic resin such as a polyimid, or a resin, in which the thermosetting resin and the thermoplastic resin are impregnated with a stiffener such as an inorganic filler, such as an ABF. In addition, a known molding material, such as an epoxy molding compound (EMC), may also be used. If necessary, the encapsulant 130 includes conductive particles to block electromagnetic waves.

If necessary, the fan-out semiconductor package 100A according to an exemplary embodiment further includes the frame 110 disposed on the one side of the redistribution layer 140 and having the through hole 110H. The frame 110 supports the fan-out semiconductor package 100A, and leads to maintaining rigidity of the fan-out semiconductor package 100A and securing uniformity of a thickness of the fan-out semiconductor package 100A. The frame 110 has the through hole 110H formed therein, and the through hole 110H has the semiconductor chip 120 disposed therein. Unlike as illustrated in FIG. 10, a greater number of through holes may be formed, and in this case, a greater number of semiconductor chips may also be disposed. In addition, a plurality of electronic components may be disposed in a single through hole. In addition, the frame 110 may include a plurality of layers, and in this case, a wiring may be formed in a space between the layers.

A material of the frame 110 is not particularly limited as long as the material may support the fan-out semiconductor package 100A. For example, an insulating material is used. The insulating material may be a thermosetting resin such as an epoxy resin, a thermoplastic resin such as a polyimid, or a resin, impregnated with a stiffener such as a glass fiber or an inorganic filler, such as a prepreg (PPG), an Ajinomoto build-up film (ABF), an FR-4 resin, a bismaleimide triazine (BT) resin, or the like. Alternatively, a metal having excellent rigidity and thermal conductivity is used. The metal may be an Fe—Ni-based alloy. A copper (Cu) plating layer is also formed on a surface of the Fe—Ni-based alloy to secure an adhesive strength between the Fe—Ni-based alloy, and a molding material or an interlayer insulating material. In addition, glass, ceramic, plastic, or the like, is also used.

If necessary, the fan-out semiconductor package 100A according to an exemplary embodiment further includes a passivation layer 150 disposed on the other side of the redistribution layer 140. The passivation layer 150 protects the redistribution layer 140 from external physical or chemical damage. The passivation layer 150 has an opening 151 exposing at least a part of a portion of the second and fourth wirings 142b and 142d of the redistribution layer 140.

A material of the passivation layer 150 is not particularly limited, and may be, for example, a solder resist. Alternatively, a material similar to those of the first and second insulating layers 141a and 141b of the redistribution layer 140, for example, a PID resin, may also be used. Alternatively, a material similar to the encapsulant 130, for example, an ABF, may also be used. The passivation layer 150 generally includes a single layer, but also includes a plurality of layers, if necessary.

The fan-out semiconductor package 100A according to an exemplary embodiment further includes an under-bump metal layer 160 disposed on a wall surface of the opening 151 of the passivation layer 150 and on the exposed second and fourth wirings 142b and 142d of the redistribution layer 140. The under-bump metal layer 160 may increase connection reliability of the connection terminal 170 to be described below, resulting in an improvement in board level reliability of the fan-out semiconductor package 100A. The under-bump metal layer 160 is formed by a known metallization method using a known conductive material, for example, a metal.

The fan-out semiconductor package 100A according to an exemplary embodiment further includes the connection terminal 170 disposed on the under-bump metal layer 160. The connection terminal 170 physically or electrically connects the fan-out semiconductor package 100A to an external power source. For example, the fan-out semiconductor package 100A is mounted on a main board of an electronic device by the connection terminal 170. The number, interval, disposition, or the like, of connection terminals 170 is not particularly limited, and may be sufficiently modified by a person skilled in the art depending on design particulars. For example, the number of the connection terminals 170 may be provided in an amount of several tens to several thousands according to the number of electrode pads 120P of the semiconductor chip 120, and may also be provided in an amount not less than or not more than several tens to several thousands.

The connection terminal 170 is formed of a conductive material such as copper (Cu), aluminum (Al), silver (Ag), tin (Sn), gold (Au), nickel (Ni), lead (Pb), titanium (Ti), a solder, or the like. However, the conductive material is only an example, and the present disclosure is not limited thereto. The connection terminal 170 may be a land, a ball, a pin, or the like. The connection terminal 170 may include a single layer or a plurality of layers. When the connection terminal 170 includes the plurality of layers, the connection terminal 170 includes a copper pillar and a solder. When the connection terminal 170 includes the single layer, the connection terminal 170 includes a tin-silver solder or copper. However, the connection terminal 170 is only an example, and the present disclosure is not limited thereto.

At least one of the connection terminals 170 is disposed in a fan-out region. The fan-out region defines a region outside of a region in which a semiconductor chip is disposed. For example, the fan-out semiconductor package 100A according to an exemplary embodiment is a fan-out package. The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a reduced thickness, and may have excellent price competitiveness.

Figure 12:
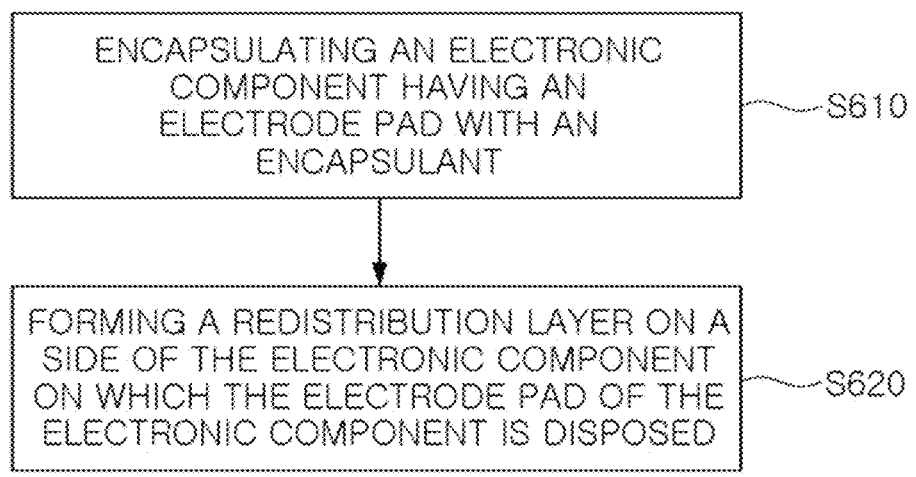
FIG. 12 is a schematic flowchart illustrating an example of a process of manufacturing the fan-out semiconductor package of FIG. 9A.

FIG. 12 is a schematic flow chart illustrating an example of a process of manufacturing the fan-out semiconductor package of FIG. 9A.

Referring to FIG. 12, a method of manufacturing the fan-out semiconductor package 100A according to an exemplary embodiment includes encapsulating the semiconductor chip 120 having the electrode pad 120P with the encapsulant 130 (S610), and forming the redistribution layer 140 on a side of the semiconductor chip 120 on which the electrode pad 120P of the semiconductor chip 120 is formed (S620). If necessary, the method further includes manufacturing the frame 110 having the through hole 110H, and disposing the semiconductor chip 120 in the through hole 110H of the frame 110.

The through hole 110H is formed using a mechanical drilling method or a laser drilling method. The through hole 110H is not limited thereto, and is also formed using a sand blasting method using particles for grinding, a dry etching method using plasma, or the like. When the through hole 110H is formed using the mechanical drilling method or the laser drilling method, the through hole 110H is subjected to a desmearing treatment, such as a permanganate method, to remove resin smearing in the through hole 110H.

The semiconductor chip 120 is disposed by a method of bonding a bonding film or the like to the other side of the frame 110 and then bonding the semiconductor chip 120 on the bonding film exposed in the through hole 110H. Any bonding film may be used as long as the bonding film may secure the frame 110 or the like, and a known tape or the like may be used as an unlimited example. The known tape may be, for example, a thermally treated thermosetting adhesive tape of which an adhesive strength is reduced by a thermal treatment, or an ultraviolet thermosetting adhesive tape of which an adhesive strength is decreased by ultraviolet irradiation. The semiconductor chip 120 is disposed in face-down form, such that the electrode pad 120P is bonded to the bonding film.

The encapsulant 130 is formed by a known method, for example, by laminating and curing an encapsulant 130 precursor. Alternatively, the encapsulant 130 is also formed by applying and curing a material of the encapsulant 130 such that the semiconductor chip 120 is encapsulated on the bonding film. The curing allows the semiconductor chip 120 to be secured. A laminating method may include, for example, a method of hot pressing a precursor, cooling the hot pressed precursor using a cold press, and separating a tool from the cooled precursor, or the like, the hot pressing including pressurizing the precursor at high temperatures for a certain period of time, depressurizing the pressurized precursor, and cooling the depressurized precursor to room temperature. An application method may include, for example, a screen printing method of applying ink with a squeegee, a spray printing method of misting and applying ink, or the like, but the present disclosure is not limited thereto.

A method of forming the redistribution layer 140, the passivation layer 150, the under-bump metal layer 160, and the connection terminal 170 will be described below.

FIGS. 13A to 13D are schematic cross-sectional views illustrating an example of a process of forming the redistribution layer, the passivation layer, and the under-bump metal layer of the fan-out semiconductor package of FIG. 9A.

Figure 13A:
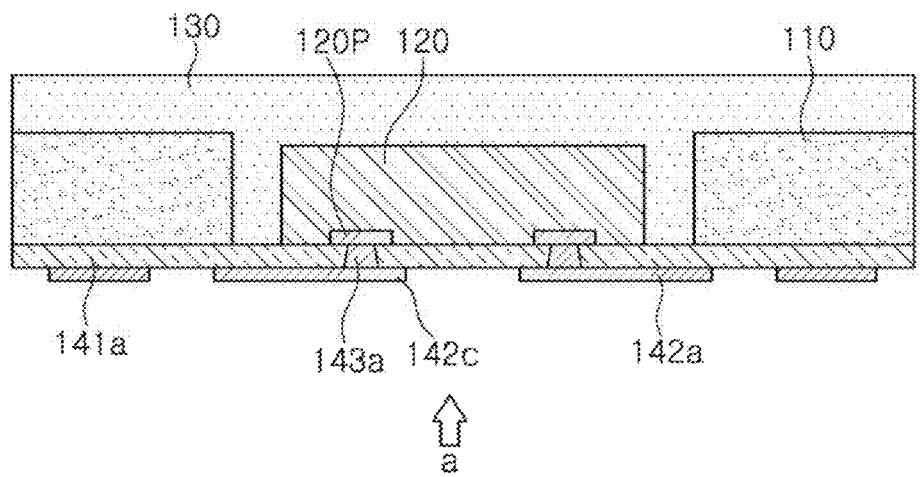
FIGS. 13A to 13D are schematic cross-sectional views illustrating an example of a process of forming the redistribution layer, a passivation layer, and an under-bump metal layer of the fan-out semiconductor package of FIG. 9A.
Figure 13A:
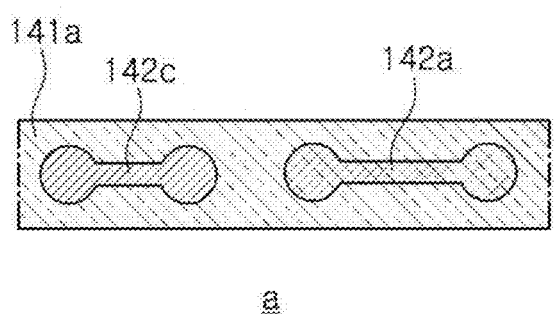

Referring to FIG. 13A, the first insulating layer 141a is formed on the side of the semiconductor chip 120 on which the electrode pad 120P of the semiconductor chip 120 is formed, the first via 143a passing through the first insulating layer 141a and connected to the electrode pad 120P is formed, and the first and third wirings 142a and 142c connected to the first via 143a are formed on the first insulating layer 141a. The first insulating layer 141a is formed by the abovementioned lamination or application method, the first and third wirings 142a and 142c are formed by the abovementioned plating process, and the first via 143a is formed by a method of forming a hole by a photolithography method, a mechanical drilling method, or a laser drilling method depending on a material of the first insulating layer 141a and filling the hole with a conductive material using a plating process or the like. However, the present disclosure is not limited thereto.

Figure 13B:
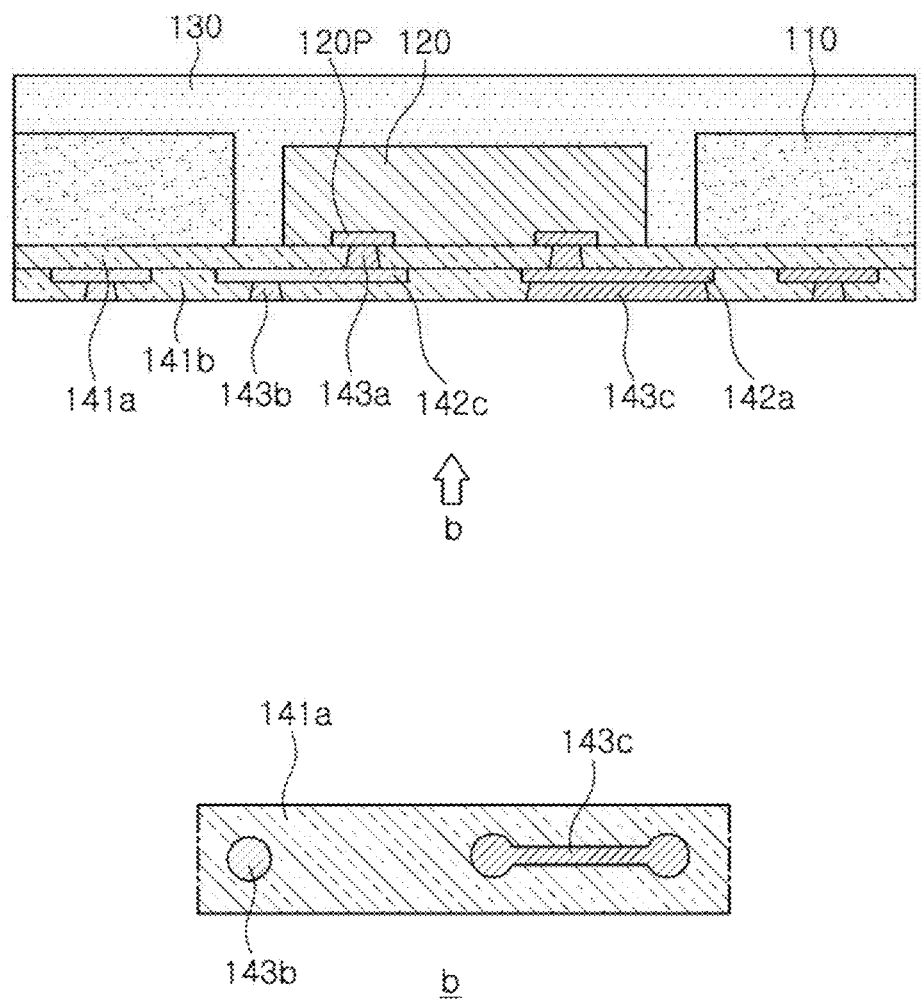

Referring to FIG. 13B, the second insulating layer 141b covering the first and third wirings 142a and 142c is formed on the first insulating layer 141a, and the line via 143c passing through the second insulating layer 141b by continuously extending the line via 143c in the second insulating layer 141b in a direction perpendicular to the thickness direction and connected to the first wiring 142a, and the second via 143b passing through the second insulating layer 141b and connected to the third wiring 142c are formed. The first insulating layer 141a is formed by the abovementioned lamination or application method, the line via 143c and the second via 143b are formed by a method of forming a through line or a hole by a photolithography method, a mechanical drilling method, or a laser drilling method and filling the hole with a conductive material using a plating process or the like. However, the present disclosure is not limited thereto.

Figure 13C:
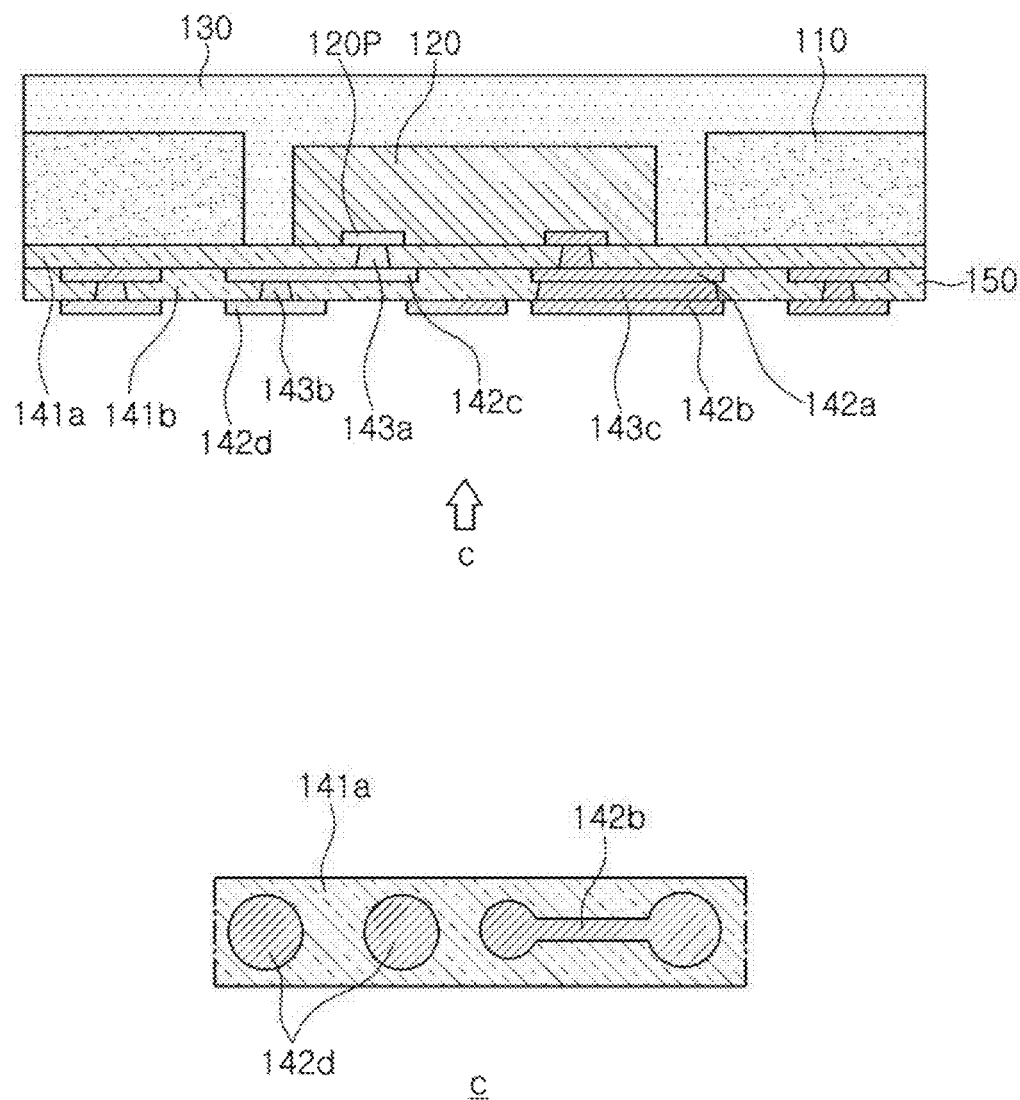

Referring to FIG. 13C, the second wiring 142b connected to the line via 143c and the fourth wiring 142d connected to the second via 143b are formed on the second insulating layer 141b. As a result, the redistribution layer 140 is formed. The second and fourth wirings 142b and 142d are formed using a plating process or the like.

Figure 13D:
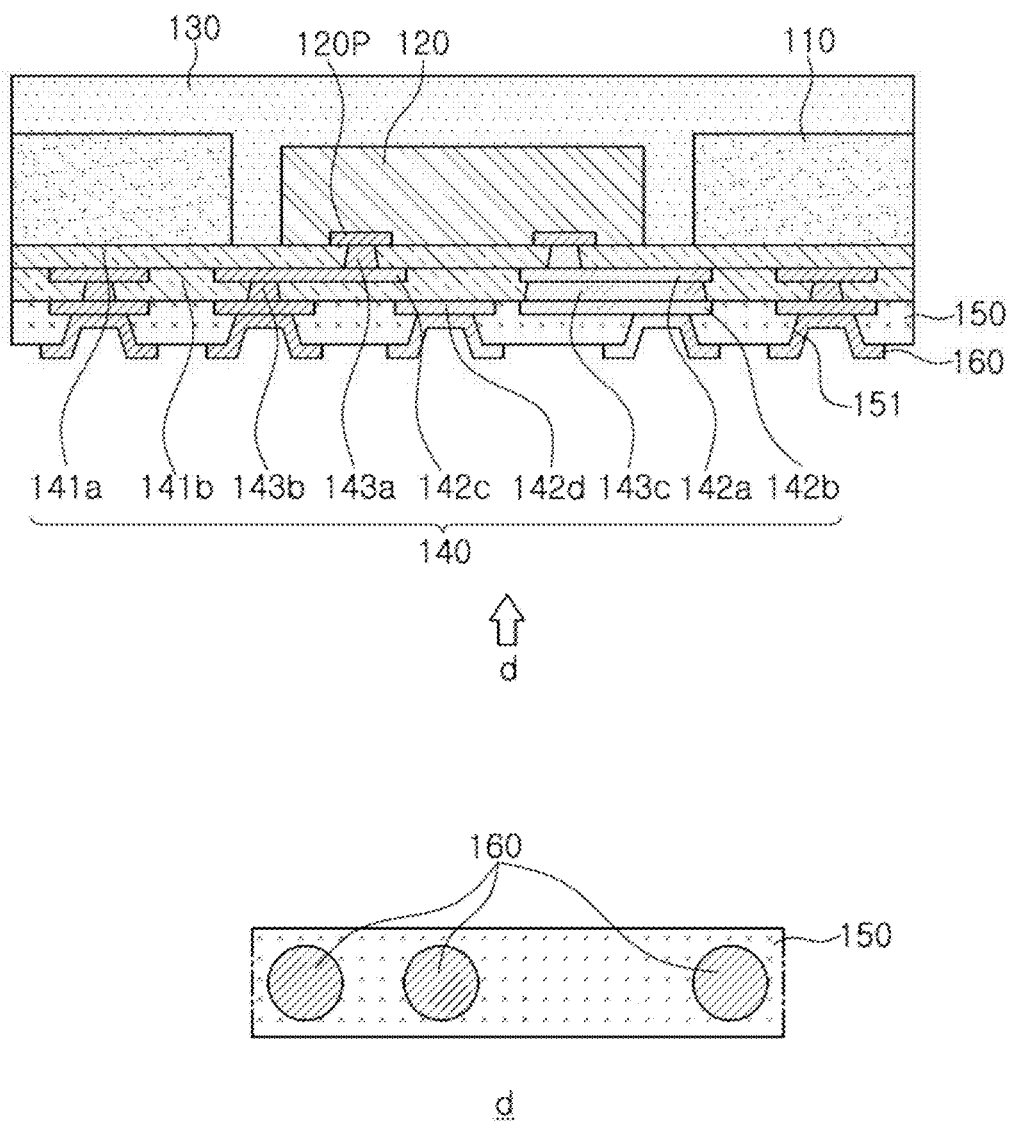

Referring to FIG. 13D, if necessary, the passivation layer 150 covering the second and fourth wirings 142b and 142d is formed, the opening 151 exposing at least a portion of the second and fourth wirings 142b and 142d is formed in the passivation layer 150, and the under-bump metal layer 160 is formed on the opening 151. Similarly, the passivation layer 150 is formed by a method of laminating and curing a passivation layer 150 precursor, a method of applying and curing a material of the passivation layer 150, or the like. The under-bump metal layer 160 is formed by a known metallization method.

If necessary, the connection terminal 170 is formed on the under-bump metal layer 160. A method of forming the connection terminal 170 is not particularly limited, and the connection terminal 170 is formed by a method well known in the related art according to a structure or shape of the connection terminal 170. The connection terminal 170 is secured by reflow, a portion of the connection terminal 170 is embedded in the passivation layer 150, and the remainder of the connection terminal 170 is externally exposed to strengthen securing force, thus increasing reliability. In some cases, the connection terminal 170 is also formed up to the under-bump metal layer 160, and thereafter, a customer company may form a connection terminal by a separate subsequent process, if necessary.

Meanwhile, a series of processes may include manufacturing a large-sized frame 110 to facilitate mass production, manufacturing a plurality of fan-out semiconductor packages 100A by the abovementioned processes, and then singulating the fan-out semiconductor packages 100A by a sawing process. In this case, productivity may be increased.

Figure 14:
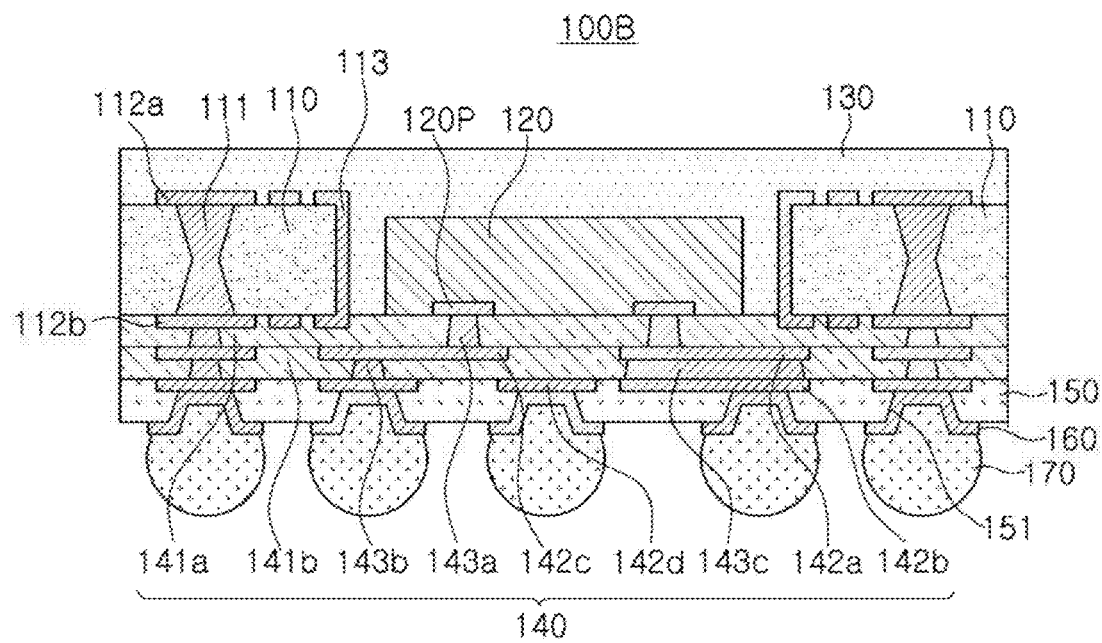
FIG. 14 is a schematic cross-sectional view illustrating another example of a fan-out semiconductor package.

FIG. 14 is a schematic cross-sectional view illustrating another example of a fan-out semiconductor package.

Referring to FIG. 14, a fan-out semiconductor package 100B according to an exemplary embodiment further includes wirings 112a and 112b disposed on both sides of a frame 110, a metal layer 113 disposed on a wall surface of the frame 110, and a via 111 disposed in the frame 110, passing through the frame 110, and connecting the wirings 112a and 112b. The wirings 112a and 112b serve to redistribute the electrode pad 120P. The via 111 electrically connects the wirings 112a and 112b. The metal layer 113 serves to distribute heat emitted by a semiconductor chip 120, or block electromagnetic waves generated thereby. In addition, other configurations are the same as described above.

Figure 15:
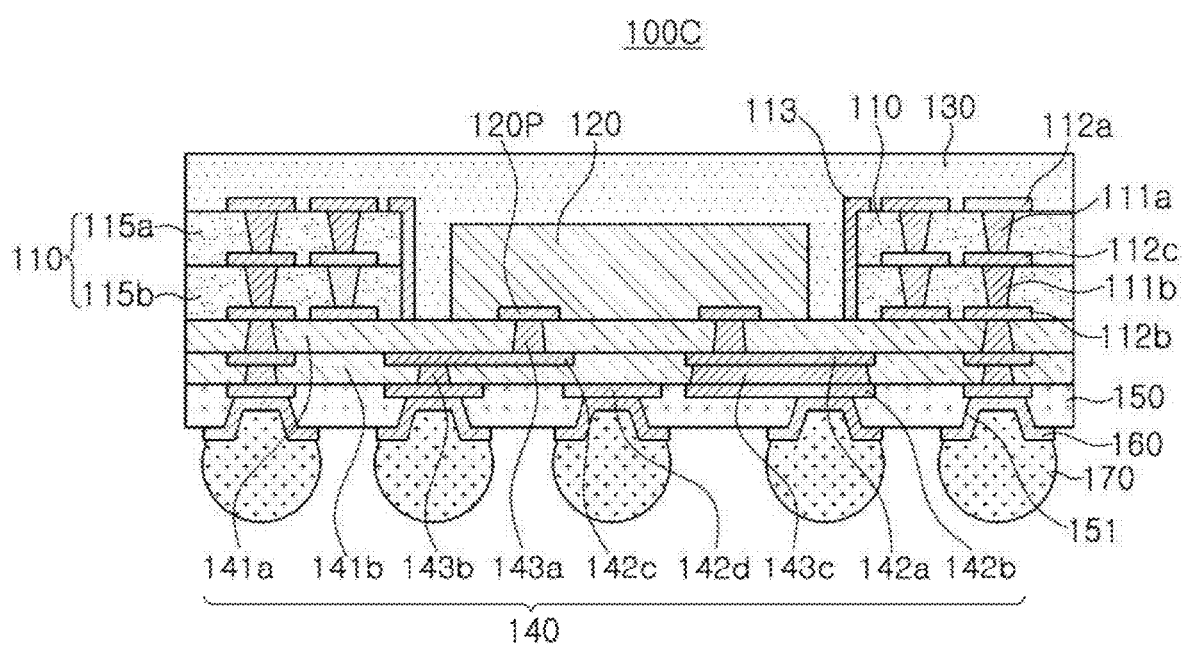
FIG. 15 is a schematic cross-sectional view illustrating another example of a fan-out semiconductor package.

FIG. 15 is a schematic cross-sectional view illustrating another example of a fan-out semiconductor package.

Referring to FIG. 15, a fan-out semiconductor package 100C has a frame 110 including multilayer support layers 115a and 115b. Wirings 112a and 112b may be disposed on both sides of a frame 110, and a wiring 112c may be disposed in the frame 110. The wirings 112a, 112b, and 112c are connected by vias 111a and 111b. A metal layer 130 is disposed on a wall surface of the frame 110. The wiring 112b is embedded in the frame 110, and an insulating distance from the redistribution layer 140 may thus be uniform. In addition, the wiring 112c disposed in the frame 110 may allow a redistribution function to be performed a greater number of times, thus improving a degree of design freedom. In addition, other configurations are the same as described above.

As set forth above, according to an exemplary embodiment, a fan-out semiconductor package, which may allow for an increase in a level of an allowable current even in a case in which the fan-out semiconductor package has a compact size and a reduced thickness, and a method of efficiently manufacturing the same.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a redistribution layer, the redistribution layer including a first insulating layer, a first wiring disposed on the first insulating layer, a second insulating layer disposed on the first insulating layer and covering the first wiring, a line via passing through the second insulating layer continuously and connected to the first wiring, and a second wiring disposed on the second insulating layer and connected to the line via;
a semiconductor chip disposed on one side of the redistribution layer, and having an electrode pad electrically connected to the first wiring, the second wiring, and the line via; and
an encapsulant disposed on the one side of the redistribution layer, and encapsulating at least a portion of the semiconductor chip,
wherein the first wiring, the second wiring, and the line via continuously extend to form a single wiring having a multilayer structure,
a length of the multilayer structure in an extending direction along which the multilayer structure extends is greater than a width of the multilayer structure in a width direction perpendicular to the extending direction, and
the extending direction and the width direction are perpendicular to a thickness direction along which the first and second insulating layer are stacked.

2. The fan-out semiconductor package of claim 1, wherein a line width of the line via is narrower than line widths of the first wiring and the second wiring.

3. The fan-out semiconductor package of claim 1, wherein a thickness of the line via is greater than thicknesses of the first wiring and the second wiring.

4. The fan-out semiconductor package of claim 1, wherein the line via has a cross-sectional area in the extending direction and the thickness direction greater than a cross-sectional area in the width direction and the thickness direction.

5. The fan-out semiconductor package of claim 1, wherein the line via is tapered in a cross section of the line via taken in the extending direction and the thickness direction as well as in a cross section of the line via taken in the width direction and the thickness direction.

6. The fan-out semiconductor package of claim 1, wherein the redistribution layer comprises a third wiring disposed on the first insulating layer, a via passing through the second insulating layer and connected to the third wiring, and a fourth wiring disposed on the second insulating layer and connected to the via.

7. The fan-out semiconductor package of claim 6, wherein the third wiring and the fourth wiring are disposed in different layers.

8. The fan-out semiconductor package of claim 1, further comprising:
a passivation layer disposed on the other side of the redistribution layer, and having an opening exposing at least a portion of the second wiring;
an under-bump metal layer disposed on the opening, and connected to the second wiring; and
a connection terminal disposed on the under-bump metal layer.

9. The fan-out semiconductor package of claim 1, wherein the redistribution layer further includes a first via passing through the first insulating layer and connected to the first wiring, a third insulating layer disposed on the second insulating layer and covering the second wiring, and a second via passing through the third insulating layer and connected to the second wiring, and
wherein in the thickness direction, the line via overlaps with the first and second vias, and the first and second vias do not overlap with each other.

10. A fan-out semiconductor package, comprising:
a redistribution layer, the redistribution layer including a first insulating layer, a first wiring disposed on the first insulating layer, a second insulating layer disposed on the first insulating layer and covering the first wiring, a line via passing through the second insulating layer continuously and connected to the first wiring, and a second wiring disposed on the second insulating layer and connected to the line via;
a semiconductor chip disposed on one side of the redistribution layer, and having an electrode pad electrically connected to the first wiring, the second wiring, and the line via;
an encapsulant disposed on the one side of the redistribution layer, and encapsulating at least a portion of the semiconductor chip; and
a frame disposed on the one side of the redistribution layer and having a through hole,
wherein the semiconductor chip is disposed in the frame, and the encapsulant is disposed on one sides of the frame and the semiconductor chip, and in a space between the frame and the semiconductor chip in the through hole.

11. A method of manufacturing a fan-out semiconductor package comprising:
encapsulating a semiconductor chip having an electrode pad with an encapsulant; and
forming a redistribution layer on a side of the semiconductor chip on which the electrode pad of the semiconductor chip is disposed,
wherein the forming the redistribution layer comprises forming a first insulating layer on the side of the semiconductor chip on which the electrode pad of the semiconductor chip is disposed, forming a first wiring on the first insulating layer, forming a second insulating layer covering the first wiring on the first insulating layer, forming a line via passing through the second insulating layer continuously and connected to the first wiring, and forming the second wiring connected to the line via on the second insulating layer,
the first wiring, the second wiring, and the line via continuously extend to form a single wiring having a multilayer structure,
a length of the multilayer structure in an extending direction along which the multilayer structure extends is greater than a width of the multilayer structure in a width direction perpendicular to the extending direction, and
the extending direction and the width direction are perpendicular to a thickness direction along which the first and second insulating layer are stacked.

12. The light emitting device package of claim 11, wherein the line via is formed by forming a through line passing through the second insulating layer continuously in a photolithography process, and filling the through line with a conductive material.

13. The method of claim 11, further comprising:
manufacturing a frame having a through hole; and
disposing the semiconductor chip in the through hole of the frame.

14. The method of claim 11, further comprising:
forming a passivation layer having an opening exposing at least a portion of the second wiring on the other side of the redistribution layer; and
forming an under-bump metal layer connected to the second wiring on the opening; and
forming a connection terminal on the under-bump metal layer.

15. The method of claim 11, wherein the line via has a cross-sectional area in the extending direction and the thickness direction greater than a cross-sectional area in the width direction and the thickness direction.

16. The method of claim 11, wherein the line via is tapered in a cross section of the line via taken in the extending direction and the thickness direction as well as in a cross section of the line via taken in the width direction and the thickness direction.

17. The method of claim 11, wherein the forming the redistribution layer further forming a first via passing through the first insulating layer to connect to the first wiring, forming a third insulating layer on the second insulating layer to cover the second wiring, and forming a second via passing through the third insulating layer to connect to the second wiring, and
in the thickness direction, the line via overlaps with the first and second vias, and the first and second vias do not overlap with each other.

* * * * *